United States Patent [19]
Adan

[11] Patent Number: 5,219,789
[45] Date of Patent: Jun. 15, 1993

[54] METHOD FOR FORMING CONTACT PORTION OF SEMICONDUCTOR DEVICE

[75] Inventor: Alberto O. Adan, Tenri, Japan

[73] Assignee: Sharp Kabushiki Kaishi, Osaka, Japan

[21] Appl. No.: 855,787

[22] Filed: Mar. 23, 1992

[30] Foreign Application Priority Data

Apr. 19, 1991 [JP] Japan .................................. 3-88723

[51] Int. Cl.⁵ .......................................... H01L 21/441
[52] U.S. Cl. .................................. 437/192; 437/247; 437/228
[58] Field of Search ............... 437/DIG. 26, 192, 202, 437/247

[56] References Cited

U.S. PATENT DOCUMENTS

| | | | |
|---|---|---|---|
| 4,465,716 | 8/1984 | Baber et al. | 437/192 |
| 4,845,050 | 7/1989 | Kim et al. | 437/192 |
| 4,924,295 | 5/1990 | Kuecher | 357/71 |
| 4,961,822 | 10/1990 | Liao et al. | 437/192 |

OTHER PUBLICATIONS

Wolf, Stanley, "Silicon Processing for the VLSI ERA", Lattrie Press, 1990, Sunset Beach, CA. pp. 242–248.

*Primary Examiner*—John S. Maples
*Attorney, Agent, or Firm*—Nixon & Vanderhye

[57] ABSTRACT

A method for forming a contact portion which comprises holing a contact hole in a dielectric layer formed on a silicon substrate, protecting at least exposed portion of the silicon substrate at the bottom of the contact hole with TiW film and then depositing tungsten in the contact hole by CVD method.

3 Claims, 1 Drawing Sheet

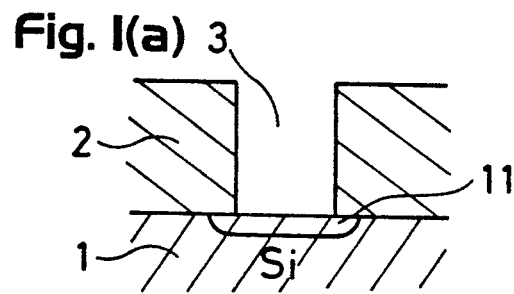
Fig. I(a)
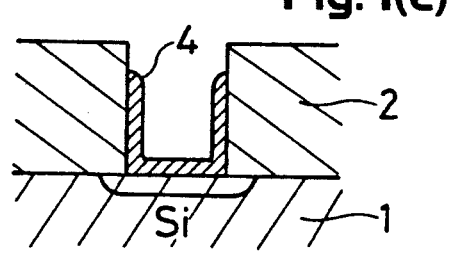
Fig. I(e)
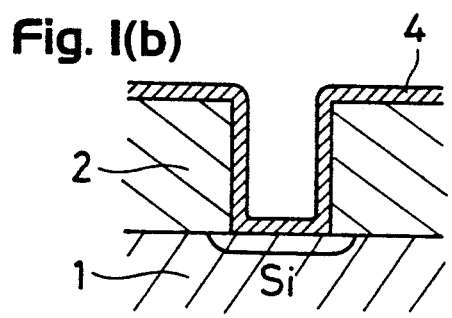
Fig. I(b)
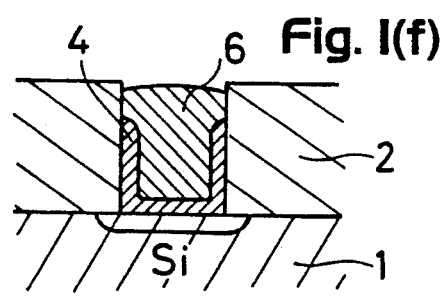
Fig. I(f)
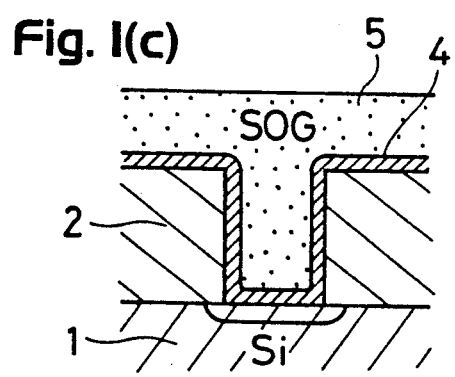
Fig. I(c)
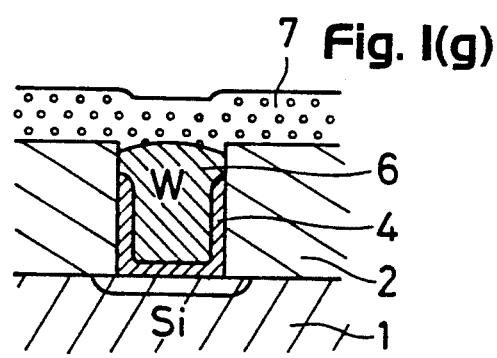
Fig. I(g)
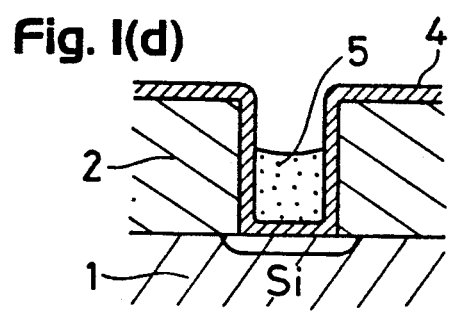
Fig. I(d)

METHOD FOR FORMING CONTACT PORTION OF SEMICONDUCTOR DEVICE

BACKGROUND OF THE INVENTION

1. Field of the Invention

The invention relates to a method for forming a contact portion of a semiconductor device, and more particularly to a method for forming a contact portion for connecting devices provided in the semiconductor device with an outside wiring.

2. Description of the Related Art

Various semiconductor devices are provided in the dielectric layers with contact holes through which any devices provided in the silicon substrates are connected with outside wirings, and conductive material is buried in the contact hole to form a contact portion. A typically known technique related to this uses CVD method to deposit tungsten for the conductive material in the contact hole and causes the same to grow selectively and be buried therein.

The tungsten selective growth technique has such an advantage that a deposit layer can be buried in the contact hole with high aspect ratio (the ratio of height B and width A of the contact holes: B/A) simply and reliably without necessity of etching-back process or the like.

However, the tungsten selective growth technique has a problem of deteriorated properties of obtained semiconductor devices resulting from the fact that $WF_6$, the material for CVD method, reacts with the surface of the silicon substrate and wastes Si in the midst of deposition of tungsten.

It has been proposed that polysilicon be substituted for tungsten to be deposited and buried in a contact hole by CVD method. Polysilicon is however hard to be selectively deposited and grown in the contact hole. Hence, a polysilicon layer is first formed on an area on the substrate including a contact hole and then etched back to allow only a deposit layer of the polysilicon in the contact hole to remain. The polysilicon deposit layer in the contact hole is doped with p-type or n-type impurity by ion implantation to be given predetermined conductivity.

The above method using polysilicon has such a problem in case of a contact hole of high aspect ratio that since height of the hole is larger, an impurity is not doped uniformly over the whole polysilicon deposit layer, resulting in that a resultant contact portion is higher in resistance.

SUMMARY OF THE INVENTION

The present invention provides a method for forming a contact portion which comprises holing a contact hole in a dielectric layer formed on a silicon substrate, protecting at least exposed portion of the silicon substrate at the bottom of the contact hole with a TiW film and then depositing tungsten in the contact hole by CVD method.

According to the present invention, the contact portion can be formed without causing increase in resistance of a semiconductor device and decomposition or deterioration of the silicon substrate.

BRIEF DESCRIPTION OF THE DRAWINGS

FIGS. 1(a) through 1(g) are explanatory sectional views showing an example of a method for forming method of a contact portion according to the present invention.

PREFERRED EMBODIMENTS OF THE INVENTION

The contact hole in the dielectric layer can be formed by using a conventional technique such as photolitography and its dimension is preferably 0.6 to 1 μm in height and 0.3 to 1 μm in width.

TiW film is deposited in the resultant contact hole formed in the dielectric layer (interlayer dielectric) on the silicon substrate. TiW film may be deposited by sputtering or the like method. Thickness of the TiW film is preferably 0.5 to 1.5 μm to substantially fill up the contact hole, and is preferably about 400 to 600 Å in thickness at the bottom of the contact portion.

The TiW film may be so provided that the exposed surface portion of the silicon substrate in the contact hole is protected, or preferably as that lower parts of the side surfaces of the contact hole are also covered to fully ensure protection of the surface of silicon substrate. The local formation of TiW film may be conducted by a conventional technique, e.g., coating the TiW film with a $SiO_2$ glass (SOG) as a mask and etching-back its film with an aqueous solution of hydrogen peroxide. The TiW film deposited on the surface of silicon substrate in the contact hole serves as a protector for the substrate upon deposition and growth of tungsten without hindering its selective growth.

Selective deposition and growth of tungsten in the contact hole after formation of the TiW film may be carried out by a commonly available technique, such as CVD method using $WF_6$ and $SiH_4$ or the like as material gas with the substrate having temperatures 240° to 300° C. The thickners of the tungsten is preferably the same as the height of the contact hole to substantially fill up the contact hole (see FIG. 1).

DESCRIPTION OF PREFERRED EMBODIMENTS

Next, the present invention will be detailed with referring to the example shown in the accompanied drawing.

FIGS. 1(a) through 1(g) are explanatory views showing an example of the method for forming the contact portion according to the present invention.

An interlayer dielectric 2 formed on a silicon substrate 1 was holed by photolithography at a position above n+ contact region 11 provided with MOS transistor to form a contact hole 3 of 1.0 μm in height and 0.6μm in width (FIG. 1(a)).

Next, TiW film 4 was deposited about 1000Å on the surface of the interlayer dielectric 2 including the contact hole by sputtering (FIG. 1(b)).

SOG 5 was then coated over the TiW film and sintered (FIG. 1(c)), and etched back with hydrofluoric acid to remove the half of SOG placed in the contact hole 3 (Fig. 1(d)).

An aqueous solution of hydrogen peroxide was used as an etchant to remove the exposed TiW film and HF to remove residual of SOG to obtain a pattern of TiW film covering the surface of silicon substrate in the contact hole 3 and lower side surfaces thereof as shown in FIG. 1(e).

Tungsten was then deposited in the contact hole by CVD method under the following conditions to selectively allow tungsten to grow in the hole 3, thereby forming a tungsten buried layer 6 (FIG. 1(f)).

Material: WF$_6$ and SiH$_4$
Feed Rate: 10/8
Temperature of Substrate: 270° C.

The resultant tungsten buried layer 6 was of high quality to uniformly fill up the contact hole irrespective of its high aspect ratio.

Aluminum was evaporated in a conventional manner to form a metal wiring layer 7 in contact with the n+ region 11 through the buried layer 6 as shown in FIG. 1(g), thereby completing a semiconductor device.

According to the above method, since the tungsten buried layer is formed with the silicon substrate being protected by the TiW film, the silicon substrate is not deteriorated. Also, since the TiW film itself which serves as the protector for the silicon substrate is an alloy to have excellent conductivity, it does not increase resistance of the contact portion. Hence, the contact portion can be provided without badly influencing on properties of the semiconductor device.

What is claimed is:

1. A method for forming a contact portion which comprises:

(a) boring a contact hole in a dielectric layer formed on a silicon substrate;
   (b) depositing a TiW film on a surface of the dielectric layer including the contact hole;
   (c) forming an SOG layer which only partially fills the contact hole;
   (d) etching the TiW film while using the SOG layer as a mask so that the TiW film remains only on a bottom surface and a portion of a side surface of the contact hole;
   (e) removing the SOG layer;
   (f) growing tungsten on the TiW film to fill the contact hole with tungsten; and,
   (g) forming a metal pattern on the dielectric layer for electrically connecting the tungsten in the contact hole.

2. The method of claim 1, wherein the thickness of the TiW film is about 400 to 600 Å at the bottom of the contact portion.

3. The method of claim 1, wherein the SOG layer is formed by:

(h) depositing a SOG film so that the contact hole is completely filled therewith;
   (i) etching back the SOG film to form a SOG layer which fills only a portion of the contact hole.

* * * * *